United States Patent
Kriz (10) Patent No.: US 7,277,033 B1
(45) Date of Patent: Oct. 2, 2007

(54) SYSTEM AND METHOD FOR SUBTRACTING DITHER REFERENCE DURING ANALOG-TO-DIGITAL CONVERSION

(75) Inventor: Jeffrey J. Kriz, Eden Prairie, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/352,636

(22) Filed: Feb. 13, 2006

(51) Int. Cl.
*H03M 1/20* (2006.01)
(52) U.S. Cl. .................. 341/131; 341/143; 341/155
(58) Field of Classification Search ............. 341/131, 341/118, 120, 143, 155
See application file for complete search history.

(56) References Cited

U.S. PATENT DOCUMENTS

| | | | |
|---|---|---|---|
| 4,417,234 A | | 11/1983 | McKenna |
| 4,896,155 A | * | 1/1990 | Craiglow ............ 341/120 |
| 4,968,987 A | | 11/1990 | Naka et al. |
| 4,996,530 A | * | 2/1991 | Hilton ............... 341/120 |
| 5,187,481 A | | 2/1993 | Hiller |
| 5,189,418 A | * | 2/1993 | Bartz et al. ......... 341/131 |
| 5,493,298 A | * | 2/1996 | Bartz ............... 341/131 |
| 6,473,019 B1 | * | 10/2002 | Ruha et al. ......... 341/143 |
| 6,661,360 B2 | | 12/2003 | Lambert |
| 7,015,851 B1 | * | 3/2006 | Bruhns et al. ....... 341/155 |
| 7,015,853 B1 | * | 3/2006 | Wolff et al. ........ 341/155 |
| 7,071,860 B2 | * | 7/2006 | Tammineedi ......... 341/143 |
| 7,116,260 B2 | * | 10/2006 | Luh ................. 341/155 |
| 2003/0112163 A1 | * | 6/2003 | Ercan et al. ........ 341/131 |

OTHER PUBLICATIONS

Dallas Semiconductor Maxim, Application Note 810, Understanding Flash ADCs, downloaded from World Wide Web at www.maxim-ic.com/an810, Oct. 2, 2001.
Manfred Bartz, Baseband vector signal analyzer hardware design—HP 89410A electronic test device—technical, Dec. 1993.
Brad Bannon, Overcoming Converter Nonlinearities with Dither, Analog Device Application Note AN-410, Dec. 1995.
David G. Morrison, Basics of Design Analog-to-Digital Converters, Electronic Design, Oct. 13, 2003.
Digital to Analog Converters, downloaded from the World Wide Web at http://www.ib.cnea.gov.ar/~servos/Convert/Digital%20to%20Analog%20Conversion.htm on Nov. 9, 2005.
Manfred Bartz, Large-scale Dithering Enhances ADC Dynamic Range, Microwaves & RF, vol. 32, Issue 5, pp. 192-198, May 1993.

* cited by examiner

*Primary Examiner*—Linh V. Nguyen
(74) *Attorney, Agent, or Firm*—McDonnell Boehnen Hulbert & Berghoff LLP (57) ABSTRACT

A system and method directed to using a dither signal during conversion of an analog input signal to a digital output signal without summing the dither signal to the analog input signal. Such conversion may include generating a digital dither signal with a pseudo-random noise generator and converting the digital dither signal to an analog dither signal. The analog dither signal is provided to an impedance network that responsively produces a set of reference dither signals proportional to the analog dither signal. A plurality of comparators compares the proportional dither signals to the analog input signal so as to generate a first output code. A dither signal reference code that indicates the effects of passing the dither signal through the analog-to-digital converter is subtracted from the first output code so as to produce a second output code that is a digital representation of the analog input signal.

23 Claims, 4 Drawing Sheets

SYSTEM AND METHOD FOR SUBTRACTING DITHER REFERENCE DURING ANALOG-TO-DIGITAL CONVERSION

GOVERNMENT RIGHTS

This invention was made with government support under contract N00164-02-D-6599, sponsored by the U.S. Navy. The U.S. Government may have certain rights in this invention.

FIELD OF INVENTION

The present invention relates to analog-to-digital converters, and more particularly to analog-to-digital converters that use dither signals during conversion of an analog input signal to a digital output signal.

DESCRIPTION OF RELATED ART

An analog-to-digital converter (ADC) provides means for converting an analog input signal into a digital output signal. Various types of ADCs are available to convert analog input signals, ranging in frequency from 0 hertz (Hz.) to 1 Giga hertz (GHz.) and beyond, into digital output signals. These various types of ADCs may include a sigma-delta ADC, a successive-approximation ADC, a pipeline ADC, or a flash ADC. Other types of ADCs are also available.

An ADC is susceptible to distortion that can reduce the performance of the ADC. The distortion may result in the ADC outputting a digital signal that indicates the value of an analog input signal is greater than or less than the true value of the analog input signal. Some ADCs use dither signals to compensate for distortion. Typically, the dither signals are uncorrelated signals (e.g., pseudo random noise) that get added to an analog input signal prior to conversion of the analog input signal into a digital output signal.

Figure 1:
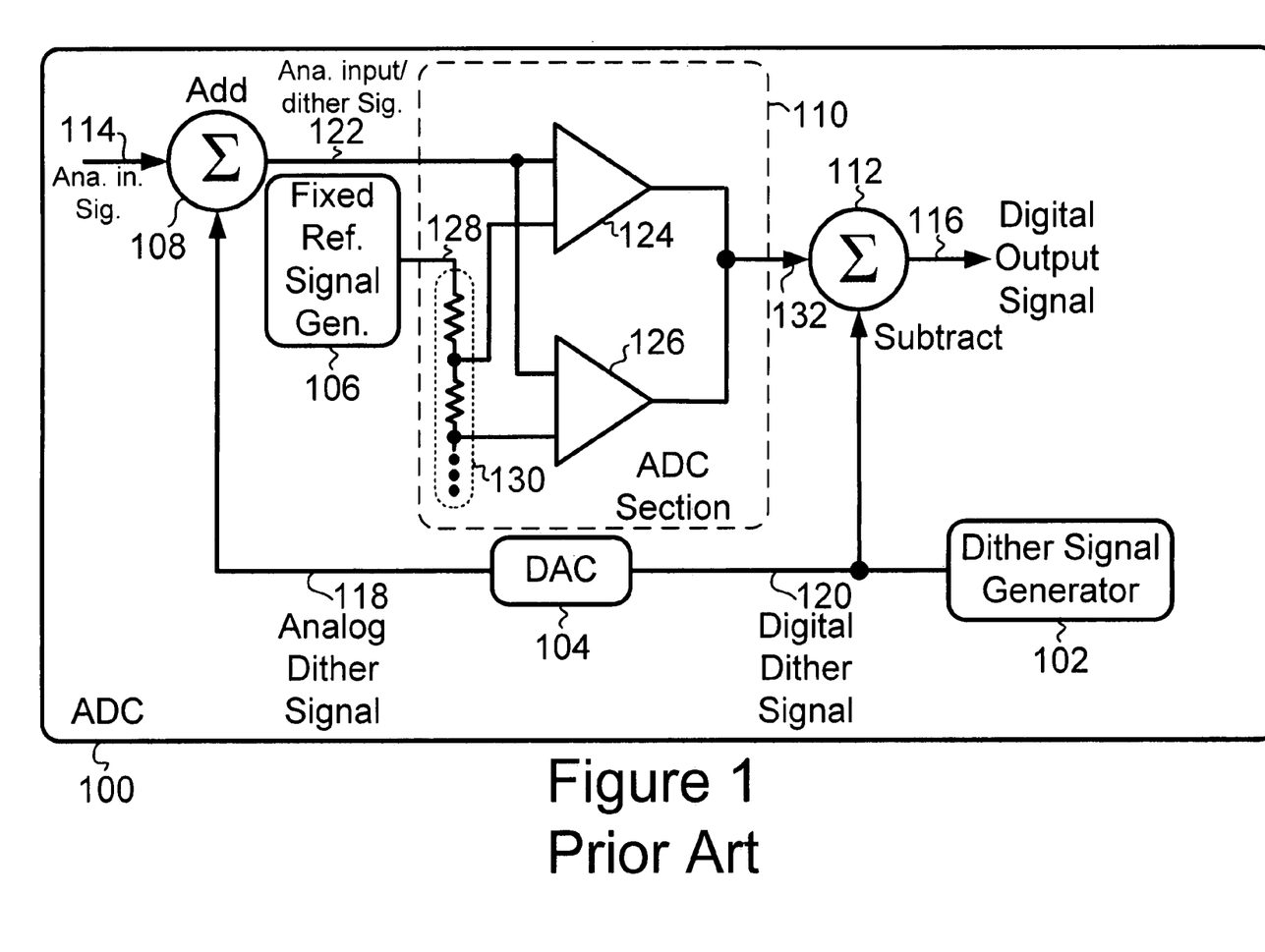
FIG. 1 is a prior art block diagram of an analog-to-digital converter.

FIG. 1 depicts a prior art arrangement for using a dither signal during conversion of an analog input signal to a digital output signal. As shown in the figure, the ADC 100 includes a dither signal generator 102, a digital-to-analog converter (DAC) 104, a fixed reference signal generator 106, an adding circuit 108, an analog-to digital converter (ADC) section 110, and a subtraction circuit 112.

The adding circuit 108 receives an analog input signal 114 that is to be converted to a digital output signal 116. The adding circuit 108 also receives an analog dither signal 118 from the DAC 104. The DAC 104 converts a digital dither signal 120 generated by the dither signal generator 102 to produce the analog dither signal 118. The adding circuit 108 adds the analog input signal 114 and the analog dither signal 118 to produce an analog input/dither signal 122.

The ADC section 110 includes a first comparator 124 and a second comparator 126. The ADC section 110 may include one or more other comparators. Each comparator of the ADC section 110 includes (i) a first input for receiving a respective reference signal proportional to a fixed reference signal 128 produced by the fixed reference signal generator 106, and (ii) a second input for receiving the analog input/dither signal 122. One or more of the reference signals proportional to the fixed reference signal 128 are produced by passing the fixed reference signal 128 through a resistor network 130. The ADC section 110 produces a digital code 132 that is representative of the analog input/dither signal 122.

The subtraction circuit 112 receives the digital code 132 and the digital dither signal 120. The subtraction circuit 112 subtracts the digital dither signal 120 from the digital code 132 to produce the digital output signal 116. The inventor has discovered, however, that merely subtracting the digital dither signal 120 from the digital code 132 does not subtract all the effects of analog dither signal 118 passing through the ADC section 110 along with the analog input signal. Therefore, an improved system and method for using dither signals to carry out conversion of an analog input signal to a digital output signal is desirable.

SUMMARY

The present invention is directed to a system and method for using a dither signal during conversion of an analog input signal to a digital output signal without performing the function of adding the dither signal to the analog input signal.

In one respect, an exemplary embodiment of the present invention may take the form of a method. The method includes (i) converting a digital dither signal to an analog dither signal, (ii) providing the analog dither signal to an impedance network and responsively producing a set of reference dither signals proportional to the analog dither signal, (iii) comparing an analog input signal to each reference dither signal of the set so as to produce a first output code, and (iv) subtracting a dither signal reference code from the first output code so as to produce a second output code.

In another respect, an exemplary embodiment of the present invention may take the form of a first system that includes: (i) a pseudo-random noise generator to generate a digital dither signal; (ii) a digital-to-analog converter to convert the digital dither signal into an analog dither signal, (iii) an impedance network to receive the analog dither signal and to responsively produce one or more reference dither signals proportional to the analog dither signal, (iv) a plurality of comparators, and (v) a logic section. Each of the comparators includes a first input, a second input, and an output. Each of the first inputs receives a particular one of the one or more reference dither signals and each of the second inputs receives an analog input signal. The outputs, in combination, generate a stream of first output codes. The logic section includes subtraction logic to subtract a particular one of a plurality of dither signal reference codes from each of the first output codes of the stream of first output codes so as to produce a stream of second output codes.

In yet another respect, an exemplary embodiment of the present invention may take the form of a second system that includes: (i) a dither signal section to generate an analog dither signal, (ii) an analog-to-digital converter (ADC), (iii) a quantization section, and (iv) a logic section. The ADC includes a plurality of comparators. Each of the comparators includes a first input, a second input, and an output that produces a stream of digital output values. The ADC includes an impedance network to receive the analog dither signal and to responsively generate one or more dither signals proportional to the analog dither signal. Each of the one or more proportional analog dither signals is provided to the first input of a particular comparator of the plurality of comparators. The ADC also includes a circuit coupled to the second input of each of the comparators. The circuit receives an analog input signal and provides the analog input signal to each of the second inputs. The quantization section is arranged to generate a stream of first output codes. Each of the first output codes comprises, in combination, a digital output value from each of the comparator outputs. The logic section is arranged to subtract one of a plurality of dither signal reference codes from each of the first output codes of the stream of first output codes so as to produce a stream of second output codes.

These as well as other aspects and advantages will become apparent to those of ordinary skill in the art by reading the following detailed description, with reference where appropriate to the accompanying drawings. Further, it should be understood that the embodiments described in this summary and elsewhere are intended to be examples only and do not necessarily limit the scope of the invention.

BRIEF DESCRIPTION OF THE DRAWINGS

Exemplary embodiments of the invention are described herein with reference to the drawings, in which.

DETAILED DESCRIPTION

1. Overview

The present invention is directed to a system and method for using a dither signal, during conversion of an analog input signal to a digital output signal, without adding the dither signal to the analog input signal. In this way, the accuracy of converting an analog input signal to a digital output signal may be improved.

The detailed description describes exemplary arrangements for carrying out the present invention. It should be understood, however, that the arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether. Further, many of the elements described herein are functional entities that may be implemented as discrete or distributed components or in conjunction with other components, in any suitable combination and location.

2. Exemplary Architecture

Figure 2:
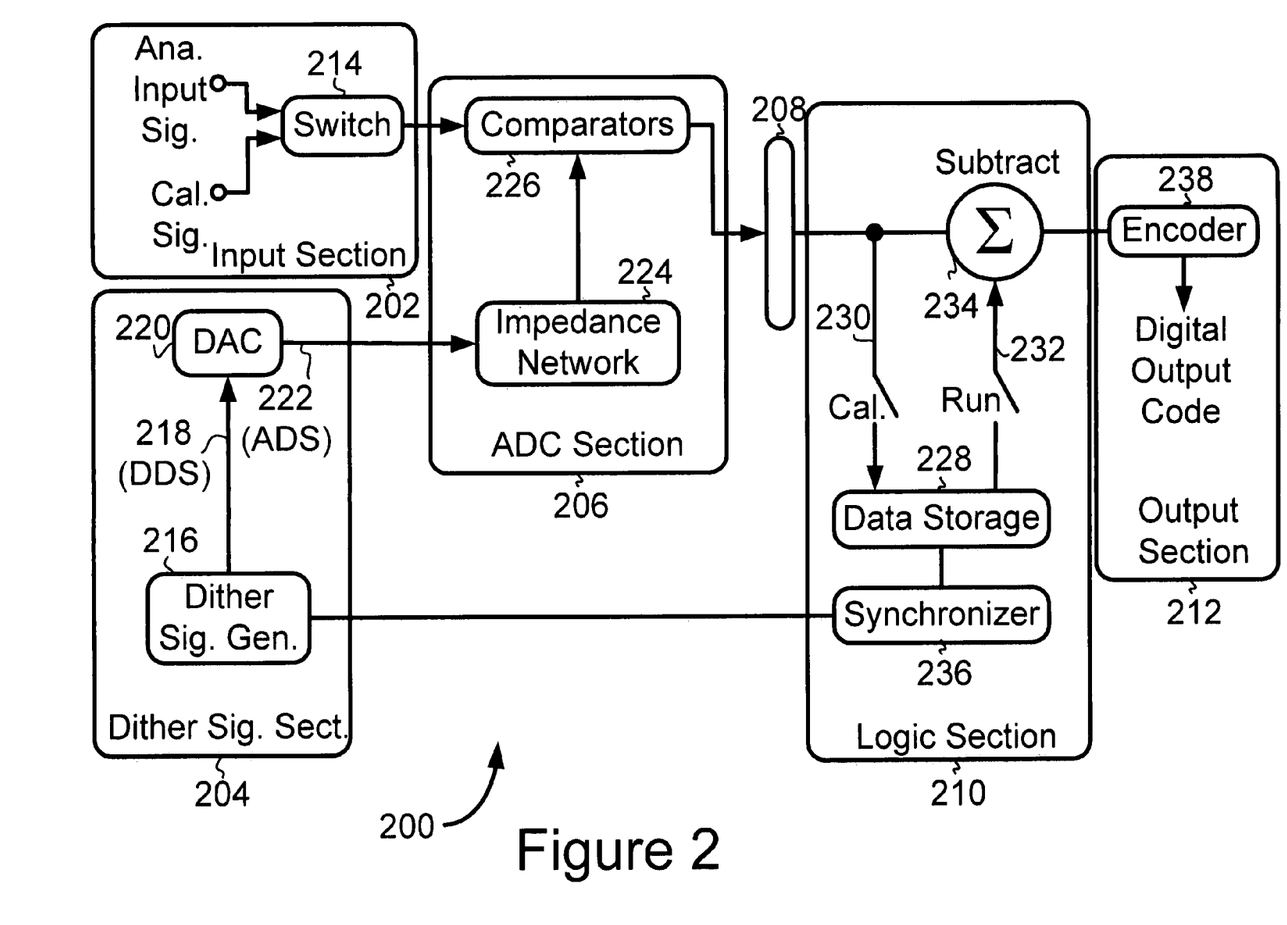
FIG. 2 is a block diagram of an analog-to-digital converter for carrying out an exemplary embodiment of the invention.

FIG. 2 depicts a system 200 for carrying out the present invention. The system 200 includes an input section 202, a dither signal section 204, an analog-to-digital converter (ADC) section 206, a quantization section 208, a logic section 210, and an output section 212. Each of the sections of the system 200 may be coupled together using any of a variety of coupling means such as an electrical circuit, a communication bus, or another type of coupling means. One or more of the sections of the system 200 may be combined (e.g., integrated together).

The system 200 may be arranged as an ADC packaged in a single integrated circuit (IC) chip. The single IC chip arrangement may include the ADC section 206 and none or any one or more of the following sections: the input section 202, the dither signal section 204, the quantization section 208, the logic section 210, and the output section 212. Any of the sections not included within the IC chip may be coupled to the IC chip. The IC chip may include one or more input pins/terminals and/or one or more output pins/terminals for coupling the IC chip to the sections not included within the IC chip.

The input section 202 comprises (i) a switch 214, (ii) means for providing an analog input signal to the switch 214, and (iii) means for providing a calibration signal to the switch 214. The means for providing the analog input signal to the switch 214 may include (i) a first pin/terminal for receiving the analog input signal, and (ii) a circuit for providing the analog input signal from the first pin/terminal to the switch 214. The means for providing the calibration signal to the switch 214 may include (i) a second pin/terminal for receiving the calibration signal, and (ii) a circuit for providing the calibration signal from the second pin/terminal to the switch 214.

The means for providing the calibration signal to the switch 214 may also include a calibration signal generator for generating a calibration signal. A generated calibration signal may comprise a signal having a given voltage greater than 0 volts and a given current greater than 0 amps. Alternatively, the calibration signal may include a null signal (e.g., the absence of voltage and current).

The switch 214 includes means for receiving the analog input signal and the calibration signal. The switch 214 may receive the analog input signal and the calibration signal simultaneously. Alternatively, at some given time, the switch 214 may receive either the analog input signal or the calibration signal. The switch 214 includes a first switch position for directing the analog input signal to the ADC section 206 and for simultaneously blocking the calibration signal from reaching the ADC section 206. The switch 214 includes a second switch position for directing the calibration signal to the ADC section 206 and for simultaneously blocking the analog input signal from reaching the ADC section 206. The switch 214 may include other switch positions, such as a third switch position for blocking the analog input signal and the calibration signal from reaching the ADC section 206.

The dither signal section 204 may be arranged in various configurations. For example, the dither signal section 204 may include a dither signal generator 216 that generates a digital dither signal 218. The digital dither signal 218 may comprise a stream of digital values representing a stream of numbers that are approximately independent of each other (i.e., pseudo-random). The dither signal generator 216 may comprise a pseudo-random noise generator to generate the pseudo-random stream. The pseudo-random noise generator may include one or more integrated circuits and/or program logic for generating the stream of digital values and for periodically repeating the function of generating the stream of digital values.

As another example, the dither signal section 204 may include a digital-to-analog converter (DAC) 220. The DAC 220 receives the digital dither signal 218 and converts the digital dither signal 218 into an analog dither signal (ADS) 222. The DAC 220 may be integrated with the dither signal generator 216. Alternatively, the DAC 220 may include an IC chip that is separate from the dither signal generator 216. Other exemplary arrangements for the DAC 220 are also possible.

The ADC section 206 may be arranged in various configurations. For example, the ADC section 206 may include an impedance network 224 and a plurality of voltage comparators 226.

Figure 3:
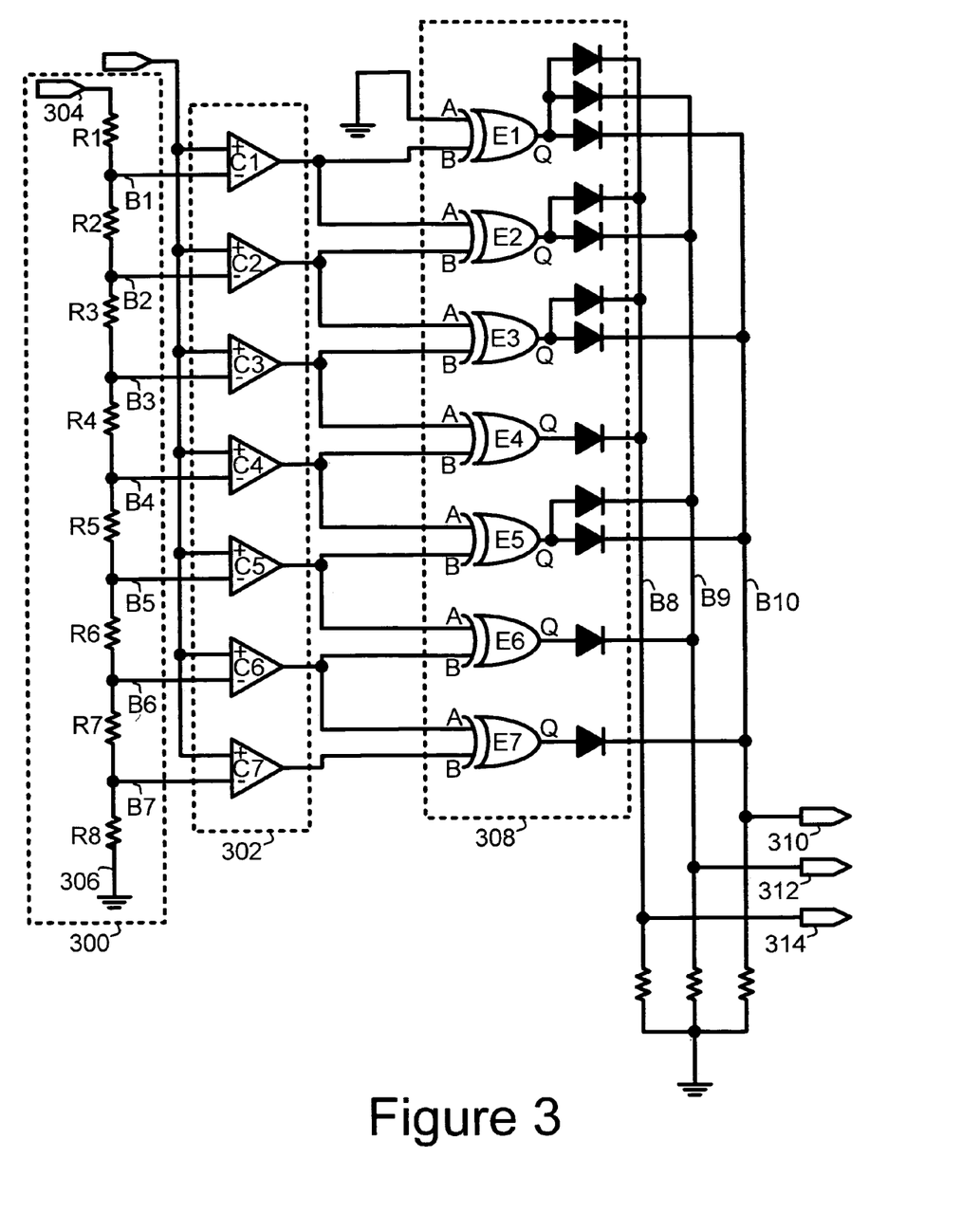
FIG. 3 depicts a circuit diagram of an exemplary analog-to-digital converter section and an exemplary quantization section.

The impedance network 224 may be arranged as the exemplary impedance network 300 shown in FIG. 3. The impedance network 300 includes eight resistors, R1, R2, R3, R4, R5, R6, R7, R8, (hereinafter "R1 through R8"). The impedance network 300 also includes and seven branches, B1, B2, B3, B4, B5, B6, B7, (hereinafter "B1 through B7"). Alternatively, the impedance network 300 may include a number of resistors greater than or less than eight and/or a number of branches greater than or less than seven.

The plurality of comparators 226 may be arranged as the exemplary plurality of comparators 302 shown in FIG. 3. The plurality of comparators 302 includes seven comparators, C1, C2, C3, C4, C5, C6, C7, (hereinafter "C1 through C7"). Alternatively, the plurality of comparators 302 may include a number of comparators greater than or less than seven.

The impedance network 300 is arranged as a voltage divider network having (i) a first end 304 for receiving the analog dither signal (ADS) 222, and (ii) a second end 306 for coupling to an electrical ground. The voltage level of the ADS, as seen at each incrementally higher numbered branch, decreases as the ADS passes from the first end 304 to the second end 306. Each of the resistors R1 through R8 reduces the ADS voltage such that each branch B1 through B7 provides a decreasingly smaller ADS voltage to a respective input of the comparators C1 through C7. The reduced ADS voltages provided to branches B1 through B7 are proportional to the ADS provided at the first end 304.

In an alternative embodiment, instead of the impedance network 224 providing a plurality of signals proportional to the ADS to the plurality of comparators 226, other means could be used to generate the reference dither signals provided to the plurality of comparators 226. For example, the dither signal section 204 and/or the ADC section 206 may include separate voltage generation circuits for generating the proportional reference ADS signals. Each of the separate voltage generation circuits could receive a digital value proportional to the DDS 218 and responsively generate a voltage that is supplied to the second input (−) of one of the comparators.

The comparators C1 through C7 each include a first input designated as "+" and a second input designated as "−." In accordance with an exemplary embodiment, depending on the position of the switch 214, the comparators C1 through C7 receive, at the first input (+) of each comparator, either the analog input signal or the calibration signal. The comparators C1 through C7 receive, at the second input (−) of each comparator, a voltage proportional to the ADS 222 via one of the branches B1 through B7. In an alternative embodiment, the comparator C1 could receive the ADS 222 directly as a result of the ADS 222 passing from the first end 304 to the comparator C1 without passing through a resistor of the impedance network 300. The signal applied to the second input (−) of each comparator is a reference signal that is compared to the signal provided on the first input (+).

The voltage comparators C1-C7 compare the voltage received at the first input (+) to the voltage received at the second input (−). If the voltage received at the first input (+) is greater than the voltage received at the second input (−), then the output of the comparator is saturated towards a positive supply voltage that is coupled to the comparator. In this regard, the output of the comparator is a "logic 1."

On the other hand, if the voltage received at the second input (−) is greater than the voltage received at the first input (+), then the output of the comparator is saturated towards a negative supply voltage that is coupled to the comparator. The negative supply voltage could be 0.0 volts, at ground level, or another voltage. In the case when the second input (−) is greater than the voltage received at the first input (+), the output of the comparator is a "logic 0."

The impedance network 300 and the plurality of comparators 302 are arranged such that, in combination, the outputs of the plurality of comparators 302 form a first output code in a temperature code format. The first output code may be configured such that the output of comparator C1 is a most significant bit of the first output code and the output of comparator C7 is a least significant bit of the first output code. The first output code may use the outputs of comparators C2, C3, C4, C5, C6, in this order, as bits between (and starting from) the most significant bit to the least significant bit. The bits from most significant to least significant may be identified as $b_1$, $b_2$, $b_3$, $b_4$, $b_5$, $b_6$, $b_7$.

As noted above, the first output code may be arranged in a temperature code format. The temperature code format uses binary digits "1" and/or "0" to indicate a digital value of the analog input signal. With the temperature code format, if the value of a given bit (e.g., $b_4$) is one and the value of the next more significant bit (i.e., $b_3$) is 0, than the value of any other bits more significant than the given bit is 0 and the value of any bits less significant than the given bit is 1.

Returning to FIG. 2, the quantization section 208 is coupled to the output of each of the plurality of comparators 226. The quantization section 208 provides means for combining the outputs of the plurality of comparators 226 so as to form the first output code. The quantization section 208 may include a multiplexer for combining the comparator outputs. Moreover, the multiplexer could periodically combine the comparator outputs so as to generate a stream of first output codes.

Alternatively, the quantization section 208 may be arranged as the exemplary quantization section 308 shown in FIG. 3. The quantization section 308 includes seven exclusive-or gates, E1, E2, E3, E4, E5, E6, E7, (hereinafter "E1 through E7"). A truth table for each of the exclusive-or gates E1 through E7 is shown in Table 1.

TABLE 1

| First Input (A) | Second Input (B) | Output (Q) |
|---|---|---|
| 0 | 0 | 0 |
| 0 | 1 | 1 |
| 1 | 0 | 1 |
| 1 | 1 | 0 |

Each of the exclusive-or gates E1 through E7 is coupled to at least one comparator of the plurality of comparators 302. The outputs (Q) of exclusive-or gates E1 through E7 are coupled to one or more output branches B8, B9, B10. A diode is located in each circuit coupling the outputs Q to the output branches B8, B9, B10.

Using the arrangement shown in FIG. 3, at any one time, only one of the exclusive-or gates E1 through E7 will have an output of 1. The remaining exclusive-or gates will have an output of 0. The output of 1 will be applied to one or more of the output branches B8, B9, B10. In this way, the first output code, arranged in a temperature code format, is encoded to be a first output code arranged in a binary coded decimal (BCD format). Table 2 shows the value of the first output code (in BCD format) in comparison to the exclusive-or gate that has an output of 1. The first output code in BCD format may be provided to output pins/terminals 310, 312, 314.

TABLE 2

| Exclusive-or Gate | First Output Code (BCD) |
|---|---|
| E1 | 111 |
| E2 | 110 |
| E3 | 101 |
| E4 | 100 |
| E5 | 011 |
| E6 | 010 |
| E7 | 001 |

As shown in table 2, the first output code is a three bit output code. In this regard, the system 200 is arranged to convert the analog input signal into a three-bit digital signal. Alternatively, the system 200 may be arranged as any multi-bit converter to convert the analog input signal into a multi-bit digital signal. As an example, the system 200 may be arranged as a multi-bit converter that converts the analog input signal into a multi-bit digital signal comprising any number of bits ranging from three bits to fourteen bits. In accordance with this example, the ADC section 206 and the quantization section 208 are arranged with appropriate circuitry to produce the desired multi-bit digital signal. Other examples of the quantity of bits of the multi-bit converter are also possible.

In accordance with another exemplary embodiment, the quantization section 308 may receive a stream of first output codes arranged in a temperature code format. The quantization section 308 can convert the stream of first output codes arranged in a temperature code format into a stream of first output codes arranged in a BCD format.

The logic section 210 may be arranged in various configurations. As shown in FIG. 2, the logic section 210 is coupled to the quantization section 208. If the quantization section 208 is arranged as the quantization section 308, the logic section 210 receives a first output code in a BCD format. Alternatively, the quantization section 208 may be arranged to combine the outputs from the plurality of comparators 226 into a first output code in a temperature code format. In this way, the logic section 210 receives a first output code in the temperature code format.

The logic section 210 includes data storage 228, a calibration-mode circuit 230, a run-mode circuit 232, subtraction logic 234, and synchronizing logic 236. The calibration-mode circuit 230 provides a path for passing output codes from the quantization section 208 to the data storage 228. The calibration-mode circuit 230 may be configured to pass output codes to the data storage 228 when the switch 214 is in its second position (i.e., the position where the calibration signal is provided to the plurality of comparators 226). The output codes stored in the data storage 228 are dither signal reference codes.

The run-mode circuit 232 provides a path for passing dither signal reference codes from the data storage 228 to the subtraction logic 234. The run-mode circuit 232 may be configured to pass dither signal reference codes when the switch 214 is in its first position (i.e., the position where the analog input signal is provided to the plurality of comparators 226). The run-mode circuit 232 and the calibration-mode circuit 230 may be the same circuit.

The subtraction logic 234 provides means for (i) receiving, from the quantization section 208, a first output code and/or a stream of first output codes, and (ii) receiving, from the data storage 228, a dither signal reference code and/or stream of dither signal reference codes. The subtraction logic 234 provides means for subtracting a respective dither signal reference code from the first output code and/or from each first output code of the stream of first output codes.

The subtraction logic 234 may perform the subtraction function on codes arranged in any of a variety of code formats. For example, the subtraction function may be carried out on a first output code and a dither signal reference code that are arranged in a temperature code format. As another example, the subtraction function may be carried out on a first output code and a dither signal reference code that are arranged in a BCD code format. Other examples of the various code formats for the subtraction function are also possible.

The result of performing the subtraction function is that a second output code or a stream of second output codes is produced. By subtracting the dither signal reference code from the first output code, the effects of passing the digital dither signal and/or the analog dither signal through the various sections of the system 200 are subtracted from the first output code so as to produce a second output code that more accurately represents the analog input signal.

The synchronizing logic 236 provides means for synchronizing that a given dither signal reference code subtracted from a given first output code corresponds to a given digital dither signal used to produce: (i) the given dither signal reference code, and (ii) the given first output code. The synchronizing logic 236 may provide means for synchronizing when the dither signal generator 216 produces each value of a repeating digital dither signal and when the data storage 228 provides the particular dither signal reference code to the subtraction logic 234.

Alternatively, the subtraction logic 234 may include a buffer that stores a plurality of dither signal reference codes. In accordance with this alternative, the synchronization logic 236 may provide an indication to the subtraction logic 234 which dither signal reference code stored in the buffer is to be subtracted from the first output codes received at the subtraction logic 234. Other examples of the synchronizing logic 236 are also possible.

The output section 212 may be arranged in various configurations. For example, as shown in FIG. 2, the output section 212 includes an encoder 238. The encoder 238 may receive, from the logic section 210, a second output code and/or a stream of second output codes. In accordance with this example, the second output code and/or the stream of second output codes may be arranged in a temperature code format. The encoder 238 may encode the second output code arranged in a temperature code format into a second output code arranged in a BCD code format. Similarly, the encoder may encode the stream of first output codes arranged in a temperature code format into a stream of output codes arranged in a BCD format.

As another example, the output section 212 may include one or more output pins that provide a means to receive a second output signal or a stream of second output signals that represent the analog input signal in digital form. In accordance with this example, the second output signal and/or the stream of second output signals may be arranged in a temperature code format or a BCD format. Other examples of configurations for arranging the output section 212 are also possible.

3. Exemplary Operation

Figure 4:
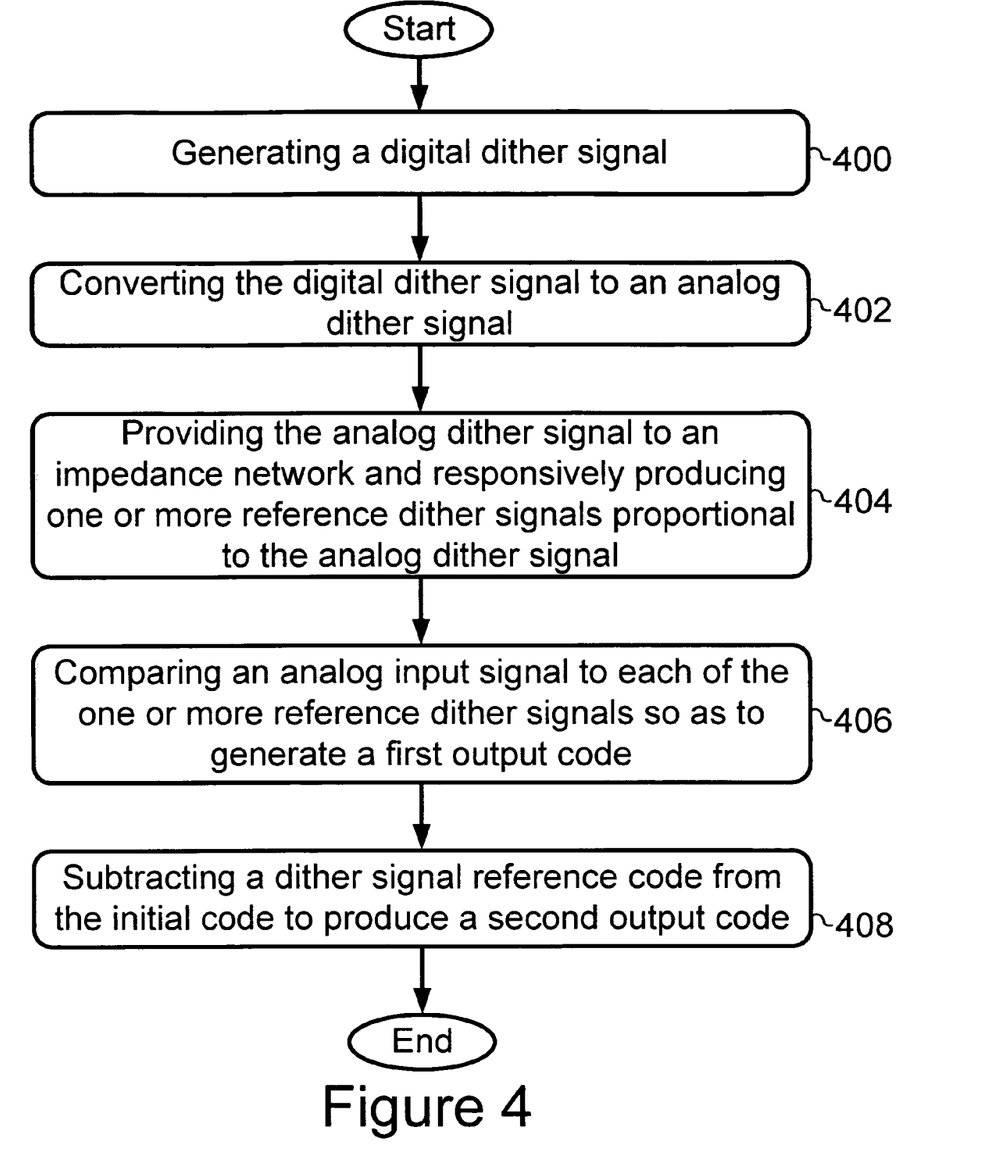
FIG. 4 is a flow chart depicting a set of functions that can be carried out in accordance with an exemplary embodiment.

FIG. 4 is a flow chart provided to illustrate some of the functions that may be carried out in accordance with exemplary embodiments of the present invention. The functions shown in FIG. 4 may be carried out in an order as shown in the figure (i.e., from top to bottom). Alternatively, the functions shown in FIG. 4 may be carried out in a different order and/or two or more of the functions may be carried out in combination.

As shown in FIG. 4, block 400 includes generating a digital dither signal. The digital dither signal may be generated by the dither signal generator 216. The digital dither signal may comprise digital values representing a voltage within a range of: (i) a selected full-scale value minus a percentage of the selected full-scale value, to (ii) the selected full-scale value plus the percentage of the selected full-scale value. The percentage of the selected full-scale value may correspond to a selected scaling value, such as a scaling value of ¼ (i.e., one fourth) or ⅓ (i.e., one third).

By way of example, if the scaling value is ⅓ and the selected full-scale value represents a voltage of 3.0 volts, then the digital dither signal may comprise digital values representing a voltage within the range of 3.0 volts minus (⅓ times 3.0 volts) to 3.0 volts plus (⅓ times 3.0 volts). In other words, the digital dither signal may comprise digital values representing a voltage within the range of 2.0 volts to 4.0 volts. Other examples of the scaling value and the selected full scale value are also possible.

The digital values of the digital dither signal may include a stream of digital values. The stream may include any number of digital values. Two or more digital values of the stream may be the same value. The stream of digital values may comprise digital values within a given range. Examples of the given range include: (i) a range of 0 to 255, and (ii) a range of −128 to 128. Other exemplary ranges for the stream of digital values are also possible. The stream of digital values of the digital dither signal may (i) periodically repeat, and (ii) be provided to the digital-to-analog converter (DAC) 220.

Next, block 402 includes converting the digital dither signal to an analog dither signal. The conversion is carried out by the DAC 220. The DAC 220 outputs an analog dither signal. In the case, where the dither signal generator 216 generates a periodically repeating stream of digital dither signals, the DAC 220 converts the stream of digital dither signals to an analog dither signal that periodically repeats.

In accordance with an exemplary embodiment, the DAC 220 may output an analog dither signal that corresponds to the selected full scale value. In accordance with the example, above, if the digital dither signal comprises digital values representing a voltage within the range of 2.0 volts to 4.0 volts, then the DAC 220 outputs an analog signal within the range of 2.0 volts to 4.0 volts. Other examples of the DAC 220 converting a digital dither signal to an analog dither signal are also possible.

Next, block 404 includes providing the analog dither signal to an impedance network and responsively producing a first set of reference dither signals proportional to the analog dither signal. The impedance network may be arranged as the impedance network 300 shown in FIG. 3. The proportional reference dither signals are provided from the impedance network to a plurality of comparators. Each comparator receives one of the proportional reference dither signals.

As the impedance network continues to receive an analog dither signal, the impedance network continues to produce additional sets of reference dither signals proportional to the analog dither signal. As the amplitude of the analog dither signal increases or decreases, the reference dither signals proportional to the analog dither signal correspondingly increase or decrease as well.

Next, block 406 includes comparing an analog input signal to each reference dither signal. The analog input signal is the signal to be converted to a digital output signal. The analog input signal may be provided to the first input of each comparator of the plurality of comparators. Each reference dither signal may be provided to the second input of a particular comparator of the plurality of comparators. Each of the comparators produces an output value that indicates whether the signal applied to its first input is greater than the signal applied to its second input.

The output values, produced by the plurality of comparators, in combination, form a first output code. The first output code is a code from which a dither signal reference code is subtracted. The value of the first output code depends, in part, on the value of the analog dither signal applied to the impedance network 224 to produce the dither signal reference codes. The first output code may be arranged in a temperature code format.

Next block 408 includes subtracting a dither signal reference code from the first output code so as to produce a second output code. In order to subtract a dither signal reference code, the dither signal reference code must be generated. The dither signal reference code may be generated by (i) generating a digital dither signal, (ii) converting the digital dither signal to an analog dither signal, (iii) providing the analog dither signal to an impedance network and responsively producing a calibration set of reference dither signals proportional to the analog dither signal, and (iv) comparing a calibration signal to each reference dither signal of the calibration set at a plurality of comparators. The plurality of comparators output values, in combination, form a code that may be stored in data storage as a dither signal reference code.

The dither signal reference code is a digital code that represents the effects of at least some of the components and circuitry used to convert an analog signal to a digital signal. For example, the dither signal reference code may represent the effects of the ADC section 206 and the quantization section 208 in converting the calibration signal to a digital signal (i.e., the digital signal reference code). The circuitry that effects the conversion of the calibration signal to the digital signal may include, for example, a circuit that couples the switch 214 to the plurality of comparators in the ADC section.

In one respect, the dither signal reference code may be arranged in a temperature code format. In another respect, the dither signal reference code may be arranged in a BCD format. The dither signal arranged in the BCD format may be produced, in part, by providing a dither signal reference code in a temperature code format to an encoder that encodes a code in a temperature format into a code in a BCD format.

Subtracting the dither signal reference code from the first output code may be carried out using subtraction logic. Alternatively, subtracting the dither signal reference code from the first output code may be carried out by adding a negative value of the dither signal reference code to the first output code. Any subtraction logic known to those skilled in the art may be used to subtract the dither signal reference code from the first output code.

The subtraction of the dither signal reference code from the first output code may be carried out in a synchronized manner. For example, the synchronized manner may involve providing the dither signal reference code and the first output code to the subtraction logic at the same time or substantially the same time. As another example, the synchronized manner may involve subtracting (i) a dither signal reference code that corresponds to a given value of a digital dither signal, from (ii) a first output code that corresponds to the given value of the digital dither signal. The given value of the digital dither signal may be generated in two different periods of a periodically repeating stream of digital dither signals. Other examples of the synchronized manner for carrying out the subtraction function are also possible.

The result of subtracting the digital dither signal reference code from the first output code is the generation of a second output code. The second output code may be arranged in various configurations. For example, if the dither signal reference code and the first output code are arranged in a BCD format, then the second output code is arranged in the BCD format as well.

As another example, if the dither signal reference code and the first output code are arranged in a temperature code format, then the second output code is arranged in the temperature code format as well. In this case, the second output code may be provided to an encoder that encodes the second output code arranged in temperature code format into a code arranged in a BCD format.

4. Conclusion

Exemplary embodiments of the present invention have been described above. Those skilled in the art will understand, however, that changes and modifications may be made to the embodiments described without departing from the true scope and spirit of the present invention, which is defined by the claims.

I claim:

1. A method comprising:
   a) converting a digital dither signal to an analog dither signal;
   b) providing the analog dither signal to an impedance network and responsively producing a first set of reference dither signals proportional to the analog dither signal;
   c) at each comparator of a plurality of comparators, receiving an analog input signal and a respective reference dither signal of the first set of reference dither signals proportional to the analog dither signal and comparing the received analog input signal to the received respective reference dither signal of the first set,
   wherein the analog input signal received at each comparator is not provided to an adding circuit prior to being received by that comparator,
   wherein an output of each comparator, in combination, produce a first output code; and
   d) subtracting a first dither signal reference code from the first output code so as to produce a second output code.

2. The method of claim 1,
   wherein the first output code, the second output code, and the first dither signal reference code are arranged in a temperature code format, and
   wherein the first dither signal reference code is produced by:
   e) performing step a,
   f) providing the analog dither signal produced in step e to the impedance network and responsively producing a calibration set of reference dither signals proportional to the analog dither signal produced in step e, and
   g) comparing a calibration signal to each reference dither signal of the calibration set so as to produce the first dither signal reference code.

3. The method of claim 2, further comprising:
   providing the second output code to an encoder; and
   at the encoder, encoding the second output code to be a code arranged in a binary coded decimal format.

4. The method of claim 1,
   wherein the plurality of comparators are coupled to an encoder, and
   wherein the first output code is arranged in a temperature code format,
   the method further comprising:
   providing the first output code to the encoder; and
   at the encoder, encoding the first output code so as to produce a second output code arranged in a binary coded decimal (BCD) format,
   wherein the first dither signal reference code is arranged in the BCD format and is produced by:
   e) performing step a,
   f) providing the analog dither signal produced in step e to the impedance network and responsively producing a calibration set of reference dither signals proportional to the analog dither signal produced in step e,
   g) comparing a calibration signal to each reference dither signal of the calibration set so as to produce the first dither signal reference code, and
   h) encoding the first dither signal reference code into the BCD format.

5. The method of claim 1,
   wherein the digital dither signal comprises a stream of digital dither signals that repeats periodically,
   wherein the analog dither signal comprises an analog dither signal that repeats periodically, and
   wherein in response to providing the analog dither signal to the impedance network, one or more additional sets of reference dither signals proportional to the analog dither signal are produced,
   the method further comprising:
   comparing the analog input signal to each reference dither signal of the one or more additional sets so as to generate a stream of first output codes; and
   subtracting one dither signal reference code of a set of additional dither signal reference codes from each first output code of the stream of first output codes so as to produce a stream of second output codes.

6. The method of claim 1, further comprising:
   synchronizing subtraction of the first dither signal reference code from the first output code such that the first dither signal reference code and the first output code are both produced from a common value of the digital dither signal.

7. The method of claim 1,
   wherein the output of each comparator of the plurality of comparators is a logic zero if the analog input signal is less than the reference dither signal that was compared to the analog input signal at that comparator, and
   wherein the output of each comparator of the plurality of comparators is a logic one if the analog input signal is greater than the reference dither signal that was compared to the analog input signal at that comparator.

8. A system comprising:
a pseudo-random noise generator to generate a digital dither signal;
a digital-to-analog converter to convert the digital dither signal into an analog dither signal;
an impedance network to receive the analog dither signal and to responsively produce one or more reference dither signals proportional to the analog dither signal;
a plurality of comparators, wherein each comparator comprises: (i) a first input to receive a particular one of the one or more reference dither signals, (ii) a second input to receive an analog input signal, and (iii) an output, wherein, in combination, the outputs of the plurality of comparators generate a stream of first output codes; and
a logic section comprising subtraction logic to subtract a particular one of a plurality of dither signal reference codes from each first output code of the stream so as to produce a stream of second output codes.

9. The system of claim 8, wherein the digital dither signal comprises a stream of digital values that repeats periodically.

10. The system of claim 8, further comprising:
an encoder to encode the stream of first output codes into a stream of second output codes,
wherein the stream of first output codes comprises codes in a temperature code format, and
wherein the stream of second output codes comprises codes in a binary coded decimal format.

11. The system of claim 10, wherein the plurality of comparators, the impedance network, the logic section and the encoder are included within a single analog-to-digital converter package.

12. The system of claim 10,
wherein the plurality of comparators, the impedance network, and the logic section are included within a common analog-to-digital converter package, and
wherein the encoder is a separate device that couples to the common analog-to-digital converter package.

13. The system of claim 8, further comprising:
an encoder coupled to the outputs of the plurality of comparators and to the logic section,
wherein the first output codes of the stream of first output codes are arranged as codes in a temperature code format, and
wherein the encoder receives the stream of first output codes and responsively encodes each first output code of the stream of first output codes as a code in a binary coded decimal format.

14. The system of claim 8, further comprising:
an input section having a switch,
wherein the switch includes a first position that (i) allows the analog input signal to pass to the second input of each of the comparators, and (ii) blocks a calibration signal from passing to the second input of each of the comparators, and
wherein the switch includes a second position that (i) allows the calibration signal to pass to the second input of each of the comparators and (ii) blocks the analog input signal from passing to the second input of each of the comparators.

15. The system of claim 14, wherein the calibration signal comprises a null signal.

16. The system of claim 8,
wherein the logic section further comprises synchronizing logic to synchronize that the particular dither signal reference code subtracted from each first output code of the stream corresponds to the one or more reference dither signals (i) received at the first inputs of the plurality of comparators, and (ii) subsequently compared to the analog input signal by the plurality of comparators to generate the stream of first output codes.

17. The system of claim 8, wherein the impedance network comprises one or more resistors arranged as a voltage divider network.

18. A system comprising:
a dither signal section to generate an analog dither signal;
an Analog-to-Digital Converter (ADC) comprising: (i) a plurality of comparators, wherein each comparator includes a first input, a second input, and an output that produces a stream of digital output values, (ii) an impedance network to receive the analog dither signal and to responsively generate one or more dither signals proportional to the analog dither signal, wherein each of the one or more proportional dither signals is provided to the first input of a particular comparator of the plurality of comparators, and (iii) a first circuit coupled to the second input of each of the comparators, wherein the first circuit receives an analog input signal and provides the analog input signal to each of the second inputs;
a quantization section to generate a stream of first output codes, wherein a given first output code of the stream corresponds to a given set of digital output values produced by the comparator outputs; and
a logic section to subtract one of a plurality of dither signal reference codes from each of the first output codes of the stream of first output codes so as to produce a stream of second output codes.

19. The system of claim 18, wherein the dither signal section comprises:
a pseudo-random number generator to generate a digital dither signal; and
a digital-to-analog converter to convert the digital dither signal to the analog dither signal.

20. The system of claim 18,
wherein the ADC further comprises an input pin for receiving the analog dither signal, and
wherein the input pin is coupled to the impedance network via a second circuit and the analog dither signal is provided to the impedance network via the second circuit.

21. The system of claim 18, wherein the first output codes, the second output codes, and the plurality of dither signal reference codes are all arranged as codes in a temperature code format.

22. The system of claim 18, wherein the logic section comprises:
data storage for storing the plurality of dither signal reference codes, and
synchronization logic to synchronize that the particular dither signal reference code subtracted from each first output code of the stream of first output codes corresponds to the one or more reference dither signals (i) received at the first inputs of the plurality of comparators, and (ii) subsequently compared to the analog input signal by the plurality of comparators to generate the stream of first output codes.

23. The system of claim 18, wherein one of the one or more dither signals proportional to the analog dither signal comprises the analog dither signal.

* * * * *